United States Patent [19]

Nielsen

[11] Patent Number: 4,462,580
[45] Date of Patent: Jul. 31, 1984

[54] HYDRAULICALLY DRIVEN X-Y STAGE

[75] Inventor: Robert J. Nielsen, Upper Black Eddy, Pa.

[73] Assignee: AT&T Bell Laboratories, Murray Hill, N.J.

[21] Appl. No.: 307,899

[22] Filed: Oct. 2, 1981

[51] Int. Cl.³ .............................................. B23Q 3/18
[52] U.S. Cl. ................................. 269/73; 250/442.1; 92/165 PR; 108/137
[58] Field of Search ..................... 269/73, 20; 108/137, 108/143; 92/162 R, 177, DIG. 1, DIG. 2, 165 PR; 250/442.1, 492.2; 74/18.2; 248/424, 178; 33/1 M, 174 TA; 408/91

[56] References Cited

U.S. PATENT DOCUMENTS

| | | | |
|---|---|---|---|
| 2,774,131 | 12/1956 | Crane | 408/91 |
| 2,957,362 | 10/1960 | Kelm | 269/73 X |
| 3,206,837 | 9/1965 | Holmes | 408/91 X |
| 3,449,910 | 6/1969 | Reynolds | 92/177 X |
| 3,572,680 | 3/1971 | Neff | 108/143 X |
| 3,638,933 | 2/1972 | Burnette et al. | 108/137 X |
| 3,772,966 | 11/1973 | Mills | 92/66 |
| 3,790,155 | 2/1974 | Longamore | 269/60 |
| 3,983,402 | 9/1976 | Arndt, Jr. et al. | 250/492.2 |
| 4,058,018 | 11/1977 | Lauper | 74/18.2 |
| 4,274,004 | 6/1981 | Kanai | 250/442.1 |

FOREIGN PATENT DOCUMENTS

| | | | |
|---|---|---|---|
| 707516 | 4/1954 | United Kingdom | 408/91 |
| 933362 | 6/1982 | U.S.S.R. | 269/20 |

OTHER PUBLICATIONS

Philips Technical Review, vol. 30, 1969, No. 5, "A Precision Lathe with Hydrostatic Bearings and Drive," by Kraakman et al., pp. 117-133.
IBM Technical Disclosure Bulletin, vol. 19, No. 2, Jul. 1976, "High Thruput Multiwafer Disc Scanner for Ion Implantation", by Balderes et al., pp. 491-492.
J. Phys. E: Sci. Instrum., vol. 16, No. 3, Mar. 1983, "A Position-Controlled Rectangular-Coordinate Table", by Garside et al., pp. 223-226.
Philips Technical Review, vol. 34, 1974, "The Opthycograph", by A. G. Bouwer et al., pp. 257-270.

Primary Examiner—Frederick R. Schmidt
Assistant Examiner—Steven P. Schad
Attorney, Agent, or Firm—Lester H. Birnbaum

[57] ABSTRACT

A hydraulically driven X-Y stage for use primarily in optical pattern generators, especially those requiring a vacuum. A pair of hydraulic cylinders (10 and 20) provide the motion along the step and slew axes. The cylinders can be constructed so that either the rod (11 and 21) or the outer carriage (12 and 22) moves due to the oil pressure differential. Hydraulic bearings (36) between the rod and carriage prevent sliding friction while providing stiffness to linear motion in undesired directions. The rods have areas designed, in combination with the bearings, to prevent rotational motion. Hollow tubes and chambers (14, 15, 41-44, and 24) are provided for feeding oil to the cylinders, and flexible metal bellows (19, 34, and 35) surround the cylinders and keep the oil contained.

13 Claims, 4 Drawing Figures

HYDRAULICALLY DRIVEN X-Y STAGE

BACKGROUND OF THE INVENTION

This invention relates to X-Y stages primarily for pattern generating apparatus, and in particular to a hydraulically driven stage which can be used in a vacuum.

X-Y stages are used in a variety of apparatus where it is necessary to move a support independently in two essentially orthogonal directions. One of the important applications of such apparatus is optical pattern generation in integrated circuit fabrication. For example, in Electron Beam Exposure Systems (EBES), masks for IC processing are generated by writing on resist-coated glass plates with an electron beam. To accomplish this, the plates must be moved continuously in a controlled manner beneath the beam, and a high degree of accuracy and speed is required for acceptable yield. In the past generation of apparatus, the writing field measured typically 4×4 inches so that stages driven by lead screw assemblies and the like were adequate. Present and future generations of apparatus require a capability of patterning a 6×6 inch field, which necessitates a speed and accuracy not easily achieved by the prior art mechanisms. In addition, electron beam exposure requires processing of the plates in a vacuum (typically at pressures less than $1 \times 10^{-5}$ Torr) where lubricants cannot easily be used. Thus, prior art stages usually had the drive means external to the vacuum with motion of the support member provided by some connecting arm (see, e.g., U.S. Pat. No. 3,790,155 issued to Longamore). With the increased field area and velocity requirements previously mentioned, it would be more efficacious to provide a closer proximity and more direct mechanical coupling between the drive means and plate support. This necessitates placing such drive means within the vacuum chamber itself.

Other types of optical pattern generators, although not requiring a vacuum, could also make use of an X-Y stage which provides high speed and accuracy. For example, step and repeat cameras are used in IC processing to pattern photoresist layers on semiconductor wafers a chip at a time. Thus, positional accuracy and speed are primary requirements. In addition, although EBES apparatus are presently used primarily for making master masks, an X-Y stage of sufficient speed may permit such apparatus to be employed for processing semiconductor wafers directly.

It is therefore a primary object of the invention to provide an X-Y stage capable of high speed and accuracy in moving and positioning a supporting member. It is a further object of the invention to provide such a stage which can be used within a vacuum.

SUMMARY OF THE INVENTION

These and other objects are achieved in accordance with the invention which is an apparatus for providing motion of a supporting member in two essentially orthogonal directions. The apparatus includes a pair of hydraulically driven cylinders with their longitudinal axes disposed essentially orthogonally and coupled to the supporting member so that each independently drives the member in one of the said directions. Each cylinder includes a carriage portion slidably engaged by a rod. Means are provided for preventing significant motion of the rod or the carriage in directions other than the longitudinal axes, which in one embodiment include rods with a rectangular cross-section. Either the carriage or the rod moves in response to oil pressure differentials in the cylinder. Means are also provided for feeding oil into the cylinders.

BRIEF DESCRIPTION OF THE DRAWINGS

These and other features of the invention are delineated in detail in the following description. In the drawing.

Figure 1:
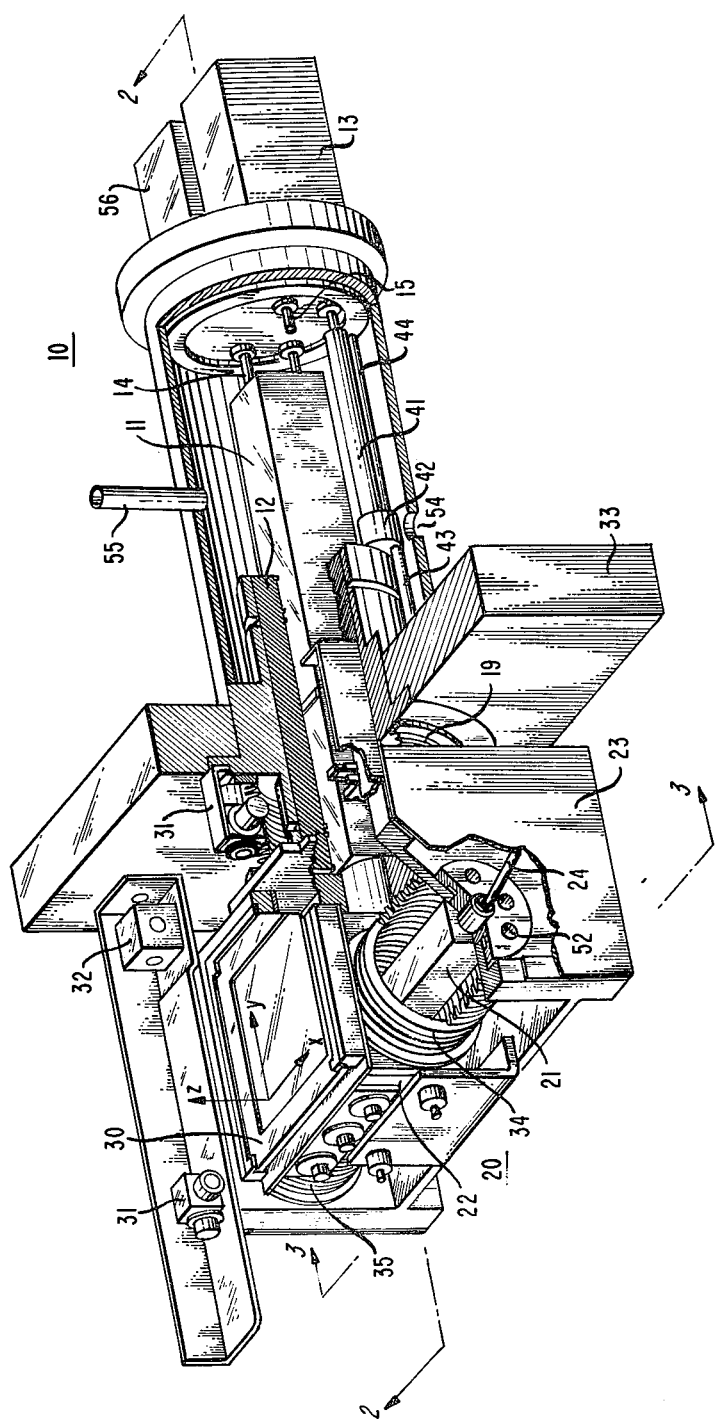
FIG. 1 is a perspective view, partly cut away, of an apparatus in accordance with one embodiment of the invention.

It will be appreciated that for purposes of illustration these figures are not necessarily drawn to scale.

DETAILED DESCRIPTION OF THE INVENTION

The invention will be described primarily with reference to the apparatus illustrated in the partly cut-away perspective view of FIG. 1, the cross-sectional view along the step axis illustrated in FIG. 2, the view along the slew axis shown in FIG. 3, and the enlarged view of the step axis cylinder shown in FIG. 4.

The apparatus includes a first hydraulic cylinder, 10, with its longitudinal axis oriented along the step axis, and a second hydraulic cylinder, 20, with its longitudinal axis oriented in the direction of the slew axis. These cylinders are coupled to a supporting member (X-Y table), 30, in a manner to be described so as to move the table independently in two essentially orthogonal directions (along the step or slew axis). In accordance with prior art apparatus, laser interferometers, 31, responsive to laser light passing through beam splitter 32, determine the position of the table at any given time. (The laser and detector are mounted external to the apparatus and therefore are not shown.)

Each cylinder includes a rod (11 and 21) and a carriage (12 and 22) slidably engaged with the rod. The X-Y table (30) is mounted directly on the carriage (22) of the slew axis cylinder which is in turn mechanically coupled to the rod (11) of the step axis cylinder through the casing (23) in which the slew axis cylinder is mounted. Thus, motion of the carriage (22) of the slew axis cylinder causes motion of the table in the X-direction and movement of the rod (11) of the step axis cylinder results in motion of the table (along with the slew axis cylinder) in the Y-direction.

Figure 2:
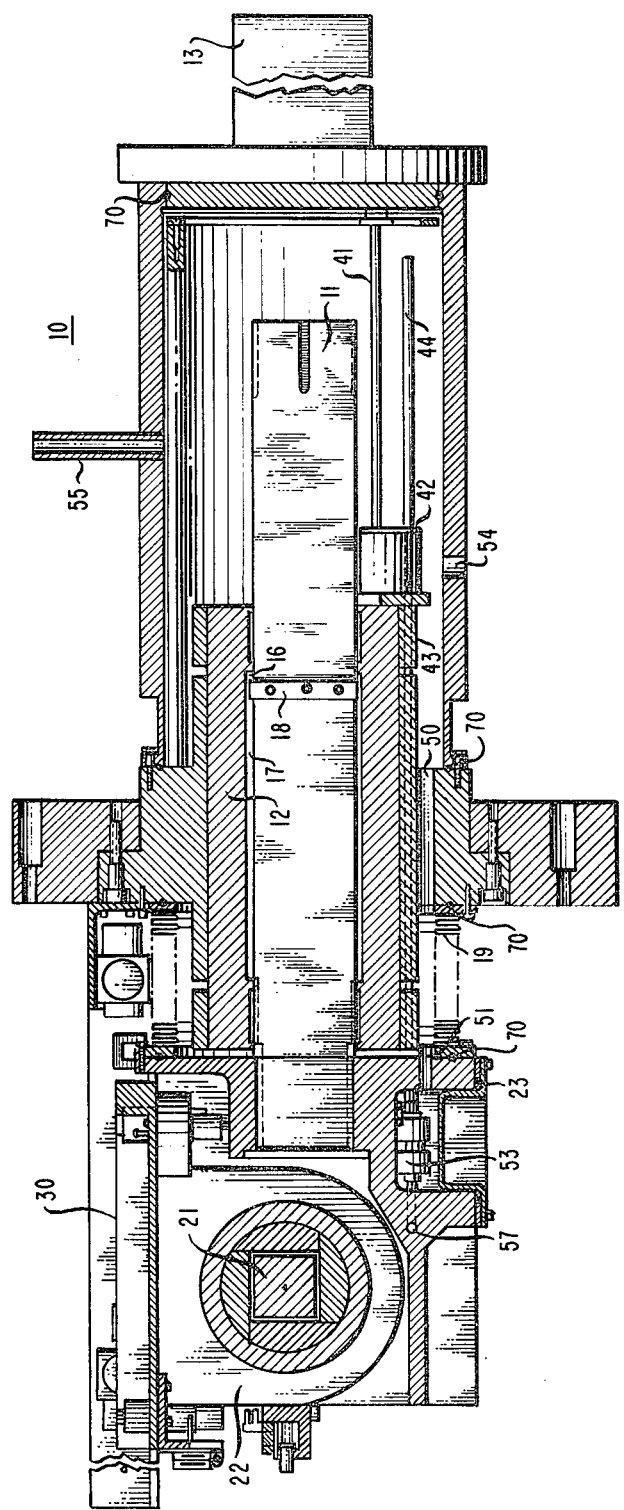
FIG. 2 is a cross-sectional view along line 2—2' of FIG. 1 illustrating further features of the same apparatus.
Figure 3:
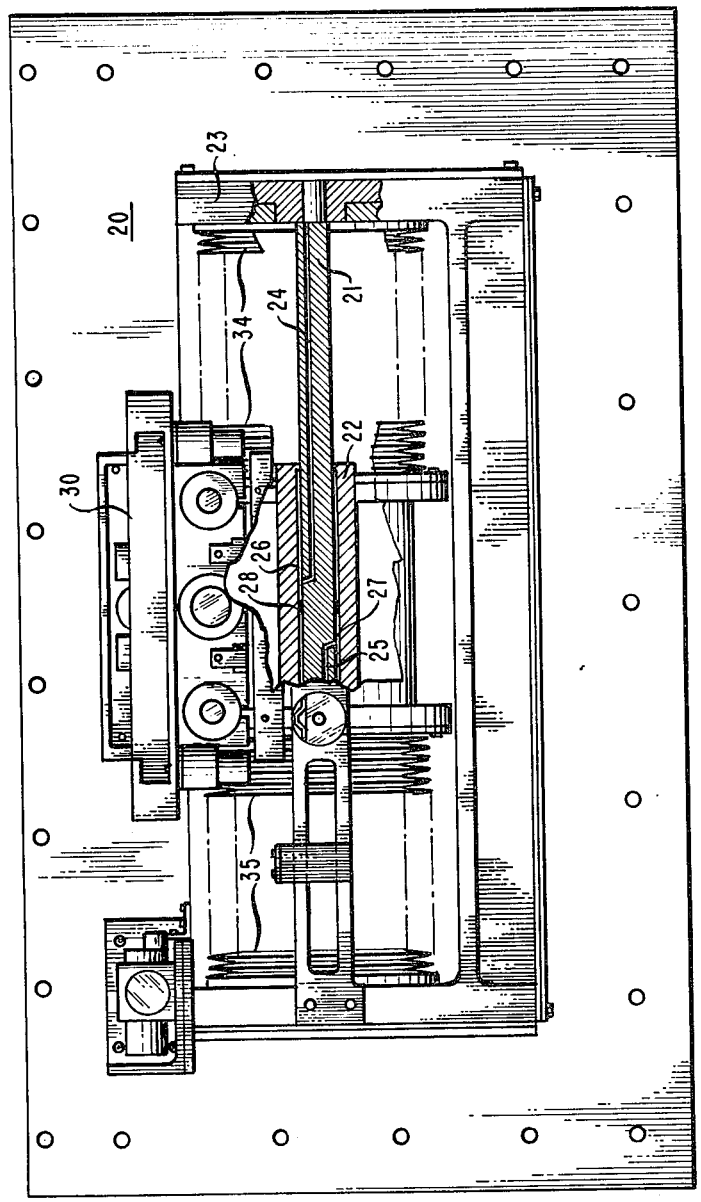
FIG. 3 is a view along line 3—3' of FIG. 1, partly cut away, illustrating further features of the same apparatus.

The views of FIGS. 2 and 3 illustrate additional details of the hydraulic cylinders. As shown in FIGS. 1 and 2, a standard servo-valve, 13, controls the flow of oil through tubes 14 and 15 which, respectively, feed oil to cavities 16 and 17 formed between the rod, 11, and carriage, 12, of the step axis cylinder. Oil is fed to the cavities through passageways (60 and 61) in the carriage as shown in FIG. 4. The cavities are separated by a standard piston element, 18, which forms a small gap of 0.002 inch with carriage 12. The presence of this gap eliminates any metal to metal contact between the carriage and rod which is usually present in prior art hydraulic cylinders, thus substantially cutting down the sliding friction. The gap will allow some leakage of oil between the cavities, but it was found that this leakage actually improved performance by providing a damping effect. A flexible bellow, 19, is coupled between the slew axis casing 23, and the step axis casing, 33, in order to contain the oil fed into the step axis cylinder. Typically, the bellow is made of stainless steel. A drain (54) is provided in the step axis cylinder outer wall to collect oil which has drained out of the cavities of either cylinder.

Similarly, as shown in FIGS. 1 and 3, oil is fed by a servo-valve, 56, into tubes 24 and 25 by some means, described later, to deliver oil to cavities, 26 and 27, formed between the rod, 21, and carriage, 22, of the slew axis cylinder. In this cylinder, oil is delivered through the rod rather than through the carriage. Again, the cavities are separated by a standard piston element, 28, which forms a small gap of 0.002 inches with the carriage. Flexible bellows, 34 and 35, are coupled to the carriage 22 and the walls of the casing 23 to contain the oil fed into the slew axis cylinder. Again, the bellows are made of stainless steel.

A differential oil pressure in cavities 16 and 17, as controlled by the standard servo-valve 13, will cause motion of the rod 11 to the left or right in FIG. 2 and thereby move the table in the Y-direction. (In FIG. 2, the rod is in its extreme right position.) A differential oil pressure in the cavities 26 and 27, controlled by the servo-valve 56, will cause motion of the carriage 22 to the left or right in FIG. 3 thereby moving the table in the X-direction.

Since the table must be positioned extremely accurately, some means is desirable to prevent motion of the rod or carriage in undesired directions (i.e., the x+z directions for the step axis and the y+z directions for the slew axis, as well as any rotational motion). In this embodiment, this stability is provided by use of rods which are rectangular in cross-section in combination with a plurality of hydraulic bearings formed at each end of the carriage of both cylinders. (It will be understood that a "rectangular" cross-section is intended to include a square cross-section.) As can be seen by the magnified, partly cut-away, view of the step axis rod and carriage in FIG. 4, each end of the carriage includes eight bearings, 36, with two facing each flat surface (64) of the rod. The presence of the bearings, which receive oil directly from the cavities (16, 17, 26, or 27), permits the carriage or rod to ride on a film of oil at least 0.5 mils thick. This film provides extreme stiffness to any deformation and so any motion other than the longitudinal motion of the rod or carriage is inhibited.

Figure 4:
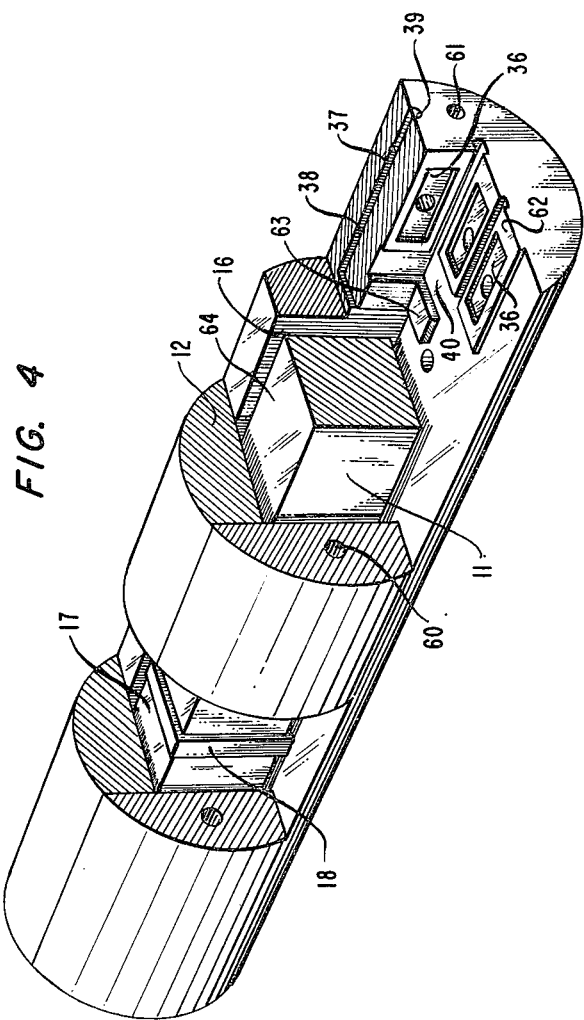
FIG. 4 is an enlarged view, partly cut away, of a portion of the same apparatus.

As FIG. 4 further illustrates, the oil from a cavity (in this case 16) is fed into bearing 36 by means of passageway 37 formed in the carriage 12. A standard restricter element, 38, regulates the flow of oil, and plug 39 is provided at the end of the carriage to prevent escape of the oil. An oil chamber, 40, is provided to collect the oil which has passed through the bearings.

Reference is now made to FIGS. 1 and 2 to illustrate the means for providing oil from the step axis cylinder to the slew axis cylinder. Oil is fed through stationary tube, 41, from the servo-valve, 56, into chamber 43, through intermediate chamber 42. Slidably mounted within the chamber 43 is hollow tube, 44, which includes holes therein for receiving the oil from the chamber and which is plugged on the right end portion. The tube, 44, is coupled to tube 24, which feeds oil into one end of the slew axis cylinder, by means of flexible joint 53. The tube 24 is inserted through hole 57 in the casing in order to couple it with said joint. The tube, 44, therefore moves in response to the motion of the table in the Y-direction while permitting oil flow between the two cylinders.

It will be appreciated that identical means is provided for feeding oil to the other end of the slew axis cylinder.

In a preferred embodiment, the apparatus is operated in a vacuum. This is possible since bellows 19, 34, and 35 contain the oil, and the apparatus is sealed by O-rings, 70, at appropriate interfaces. Further, some means is provided for creating a vacuum within the oil enclosure to prevent buckling of the bellows. This means includes a vacuum tube, 55, which is coupled to a standard vacuum pump (not shown) and inserted into the step axis cylinder 10. In addition to evacuating the step axis cylinder, the means also evacuates the slew axis cylinder, 20, through passageways 50, 51, and 52 illustrated in FIGS. 1 and 2. The resulting pressure within the oil enclosure is typically $10^{-2}$ Torr.

In a typical embodiment, the table had a velocity along either axis of approximately 10 cm/second. The rods measured approximately 24 inches, and the carriage measured approximately 12 inches. The weight of the table which was supported by the slew axis cylinder was approximately 5 pounds.

A key feature of the apparatus is to provide sufficient stiffness to motion of the table in undesired directions to permit a high degree of accuracy in the writing of images. Thus, a stiffness of approximately 6–8 million pounds per inch was produced in the hydraulic bearings. This was accomplished by employing hydraulic bearings in the shape of rectangles each covering a surface area of approximately 1 inch$^2$. The oil pressure ranged from 400–500 psi. The size of the gap between the rod and the bearing sill 62 was in the range 0.3–0.5 mils. The same gap should be formed between the piston end seal 63 and the rod. The gap between the rod and carriage in the area of the cavities (16, 17, 26, 27) was approximately 90 mils.

It will be appreciated that the above dimensions are illustrative only and may be varied to fit particular needs.

It should be understood that several variations on the basic invention are possible. For example, the slew axis cylinder could be placed over and be supported by the step axis cylinder. In such a case, movement of the table in the Y-direction would be accomplished by longitudinal motion of the carriage of the step axis, upon which the slew axis cylinder and table are mounted. The rod of the step axis cylinder in such an embodiment would be stationary. Otherwise, all other elements would be identical with the previously described embodiment or involve only slight modification.

Further, the rods need not be rectangular in order to prevent rotational motion, as long as some portion of the rods' surface facing the bearings is flat. Thus, the cross section could be hexagonal, a flattened-out cylinder, or other suitable shape. Also, the portion of the rod on one side of the piston element could be cylindrical as long as the portion on the other side of the piston element has flat surfaces.

Various additional modifications will become apparent to those skilled in the art. All such variations which basically rely on the teachings through which the invention has advanced the art are properly considered within the spirit and scope of the invention.

What is claimed is:

1. Apparatus for providing motion of a supporting member (30) in two essentially orthogonal directions comprising:

a pair of hydraulically driven cylinders (10 and 20) disposed with their longitudinal axes essentially orthogonal and coupled to said supporting member so that each independently drives said member in one of said directions, each of said cylinders including a carriage portion (12 and 22) slidably engaged over a rod (11 and 21) having flat surfaces (64), the supporting member (22) being mounted over the carriage of at least one of the cylinders;

means for preventing significant motion of the rod or carriage in a direction other than along their longitudinal axes comprising a plurality of hydraulic bearings (36) formed near the edges of each carriage facing each flat surface of the rod over which the carriage is engaged and adapted to produce a film of oil between the rod and carriage which provides stiffness to any deformation and which also prevents significant rotational motion of the rod or carriage in combination with the flat surfaces of the rod; and means (14, 15, 41–44, and 24) for feeding oil into said cylinders.

2. The apparatus according to claim 1 wherein the rods have a rectangular cross-section, and bearings are included near the edges of each carriage facing each surface over which the carriage is slidably engaged.

3. The apparatus according to claim 1 further comprising flexible means (19, 34 and 35) surrounding a portion of said cylinders for keeping oil contained therein.

4. Apparatus according to claim 1 wherein the cylinder (20) over which the supporting member is mounted is in turn mounted in a casing (23) and the other cylinder (10) is mechanically coupled thereto.

5. Apparatus according to claim 4 wherein the carriage (22) over which the supporting member is mounted is adapted to move in one of said directions in response to oil pressure differentials in the cylinder (20) and the rod of the other cylinder (10) is coupled to the casing and adapted to move in the other of said directions.

6. The apparatus according to claim 1 wherein the cylinders are adapted to be driven in a vacuum.

7. Apparatus according to claim 6 wherein there is included within at least one cylinder means (55) for forming a vacuum therein.

8. Apparatus according to claim 1 wherein the means for feeding oil into one of the cylinders comprises hollow tubes (14 and 15) coupled through the carriage (12) to cavities (16 and 17) formed between the rod and carriage of the cylinder.

9. Apparatus according to claim 1 further comprising means (37, 38, 39) within each carriage for feeding oil from the cavities (16, 17, 26, 27) between rod and carriage to the bearings.

10. Apparatus according to claim 1 wherein cavities (16, 17, 25, 26) are formed between the rod and carriage of each cylinder, which cavities within each cylinder are separated by a piston element (18, 28) which leaves a small gap with the carriage to reduce sliding friction during operation of the apparatus.

11. Pattern generating apparatus including apparatus for providing motion of a supporting member (30) in two essentially orthogonal directions within a vacuum environment comprising:

a pair of hydraulically driven cylinders (10 and 20) with their longitudinal axes disposed essentially orthogonally and each including a carriage portion (12 and 22) slidably engaged over a rod (11 and 21) having flat surfaces where the supporting member is mounted over the carriage (22) of at least one cylinder and the other cylinder is coupled to said member so that each cylinder independently drives said member in one of said directions;

a plurality of hydraulic bearings (36) formed near the edges of each carriage and facing each flat surface of the rod on which the carriage is slidably engaged so that during operation a thin film of oil will be formed between carriage and rod to prevent sliding friction, to prevent significant motion of rod or carriage in any direction other than along the longitudinal axis of the cylinder, and, in combination with the flat surfaces of the rod, to prevent significant rotational motion of the rod or carriage;

means (14, 15, 41–44, and 24) for feeding oil into the cylinders;

flexible means (19, 34, and 35) surrounding a portion of said cylinders for keeping oil contained therein; and means (55) for forming a vacuum within said cylinders.

12. Apparatus for providing motion of a supporting member (30) in two essentially orthogonal directions within a vacuum environment comprising:

a first hydraulically driven cylinder (20) mounted in a casing (23) with its longitudinal axis disposed along one of said directions and comprising a first carriage portion (22) slidably engaged over a first rod (21) having a rectangular cross-section, the supporting member being mounted over said carriage and said carriage adapted to move along the longitudinal axis in response to oil pressure differentials in cavities (26 and 27) defined between the rod and carriage;

a second hydraulically driven cylinder (10) having its longitudinal axis disposed along the other of said orthogonal directions and comprising a second carriage portion (12) slidably engaged over a second rod (11) having a rectangular cross-section, the rod being adapted to move along the longitudinal axis in response to oil pressure differentials in cavities (16 and 17) defined between the rod and carriage and the rod being mechanically coupled to the casing in which the first cylinder is mounted;

piston elements (18, 28) separating the cavities between the rod and carriage of each cylinder but forming a small gap with the carriage to prevent sliding friction;

a plurality of hydraulic bearings (36) formed near the edges of each carriage and facing each surface of the rod over which the carriage is slidably engaged so that during operation a thin film of oil will be formed between carriage and rod to prevent sliding friction, to prevent significant motion of rod or carriage in any direction other than along the longitudinal axis of the cylinder, and, in combination with the rectangular cross-section of the rod, to prevent significant rotational motion of the rod or carriage;

means (14, 15, 41–44, and 24) for feeding oil into the cylinders;

flexible means (19, 34, and 35) surrounding at least a portion of said cylinders for keeping oil contained therein; and means (55) for forming a vacuum within said cylinders.

13. Apparatus for providing motion of a supporting member (30) in two essentially orthogonal directions comprising:

- a pair of hydraulically driven cylinders (10 and 20) disposed with their longitudinal axes essentially orthogonal and coupled to said supporting member so that each independently drives said member in one of said directions, each of said cylinders including a carriage portion (12 and 22) slidably engaged on a rod (11 and 21);
- means for preventing significant motion of the rod or carriage in a direction other than along their longitudinal axes;
- means for feeding oil into one of the cylinders comprising hollow tubes (14 and 15) coupled through the carriage (12) to cavities (16 and 17) formed between the rod and carriage of the cylinder; and
- means for feeding oil into the other cylinder comprising:
- a fixed hollow tube (41) disposed in said one cylinder;
- a chamber (43) also disposed in said one cylinder and coupled to said first tube so that oil may be received in said chamber;
- a second hollow tube (44) slidably mounted in said chamber, said tube including holes therein for receiving oil from the chamber;
- a third hollow tube (24) coupled to passageways in the rod (21) of the other of said cylinders extending to a cavity (26) formed between the rod and carriage of said cylinder; and
- flexible means (53) coupling said second and third hollow tubes.

* * * * *